(12) United States Patent
Bhattacharyya et al.

(10) Patent No.: US 10,187,017 B2
(45) Date of Patent: Jan. 22, 2019

(54) CLOCKING SCHEME IN NONLINEAR SYSTEMS FOR DISTORTION IMPROVEMENT

(71) Applicant: MaxLinear, Inc., Carlsbad, CA (US)

(72) Inventors: Prasun Kali Bhattacharyya, Bangalore (IN); Abhishek Ghosh, Bangalore (IN); Prasenjit Bhowmik, Bangalore (IN)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 15/478,713

(22) Filed: Apr. 4, 2017

(65) Prior Publication Data

US 2018/0198419 A1    Jul. 12, 2018

(30) Foreign Application Priority Data

Jan. 7, 2017 (IN) .............................. 201711000734

(51) Int. Cl.
| | |
|---|---|
| *H04B 1/04* | (2006.01) |
| *H03F 1/32* | (2006.01) |
| *H04L 7/00* | (2006.01) |
| *G11B 20/22* | (2006.01) |
| *H03M 1/06* | (2006.01) |

(Continued)

(52) U.S. Cl.
CPC .............. *H03F 1/32* (2013.01); *G11B 20/22* (2013.01); *H03M 1/0614* (2013.01); *H04B 1/0475* (2013.01); *H04B 1/10* (2013.01); *H04L 7/0008* (2013.01); *H03M 1/0624* (2013.01); *H03M 1/66* (2013.01)

(58) Field of Classification Search
CPC .......... H04B 1/0475; H04B 2001/0425; H04B 1/525; H04B 10/2507; H04B 10/58; H04B 1/123; H04B 1/62; H04B 1/0483; H04B 1/12
See application file for complete search history.

(56) References Cited

U.S. PATENT DOCUMENTS

| | | | | |
|---|---|---|---|---|
| 4,012,591 | A * | 3/1977 | Sailer ...................... | H04L 7/033 375/373 |
| 6,198,416 | B1 * | 3/2001 | Velazquez ........... | H03M 1/0614 341/118 |

(Continued)

*Primary Examiner* — Vineeta S Panwalkar
(74) *Attorney, Agent, or Firm* — McAndrews, Held & Malloy, Ltd.

(57) ABSTRACT

Systems and methods are provided for clocking scheme to reduce nonlinear distortion. An example system may comprise at least two processing paths, each comprising at least one circuit exhibiting nonlinear behavior. Nonlinearity may be managed during processing of signals, such as by assessing effects of the nonlinear behavior during the processing of signals, and controlling clocking applied via at least one path based on the assessed effects, to reduce the effects of the nonlinear behavior during the processing of signals, eliminating the need for post-processing corrections. The controlling of clocking may comprise adjusting timing of a clock applied in the at least path, such as by introducing a timing-delay adjustment to a clock when the clock is applied to a circuit after the circuit exhibiting nonlinear behavior. A timing-advancement may be applied to signals processed via the at least one path, particularly before the circuit exhibiting nonlinear behavior.

25 Claims, 6 Drawing Sheets

(51) Int. Cl.
*H04B 1/10* (2006.01)
*H03M 1/66* (2006.01)

(56) References Cited

U.S. PATENT DOCUMENTS

| | | | |
|---|---|---|---|
| 8,942,574 B2* | 1/2015 | Nakashima | H04B 10/697 398/15 |
| 2006/0156206 A1* | 7/2006 | Shen | H03M 13/1148 714/784 |
| 2006/0285578 A1* | 12/2006 | Weisenhorn | H04B 1/7176 375/130 |
| 2014/0301743 A1* | 10/2014 | Nakashima | H04B 10/697 398/209 |

* cited by examiner

CLOCKING SCHEME IN NONLINEAR SYSTEMS FOR DISTORTION IMPROVEMENT

CLAIM OF PRIORITY

This patent application makes reference to, claims priority to and claims benefit from Indian Patent Application Serial No. 201711000734, filed Jan. 7, 2017. The above identified application is hereby incorporated herein by reference in its entirety.

TECHNICAL FIELD

Aspects of the present disclosure relate to communications. More specifically, various implementations in accordance with the present disclosure relate to methods and systems for clocking scheme in nonlinear systems for distortion improvement.

BACKGROUND

Various issues may exist with conventional approaches for handling nonlinearity in communication systems. For example, conventional systems and methods, if any existed, for handling distortion in nonlinear systems may be costly, cumbersome, or inefficient—e.g., they may be complex, time consuming, require considerable power, and/or may fail to address distortion introduced by the nonlinearity and/or may introduce errors or distortion.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for a clocking scheme in nonlinear systems for distortion improvement, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE INVENTION

As utilized herein the terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z." As utilized herein, the term "exemplary" means serving as a non-limiting example, instance, or illustration. As utilized herein, the terms "for example" and "e.g.," set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Various implementations in accordance with the present disclosure are directed to providing a clocking scheme in nonlinear systems for distortion improvement. An example method, in accordance with the present disclosure, may comprise managing nonlinearity in a system (e.g., transceiver) which may comprise at least two separate paths for use when processing signals, and with each path comprising at least one circuit exhibiting nonlinear behavior during the processing of signals. The managing of nonlinearity may comprise assessing effects of the nonlinear behavior during the processing of signals, and controlling clocking applied via at least one path used during the processing of signals, based on the assessed effects. The controlling may be configured to reduce the effects of the nonlinear behavior during the processing of signals, thus eliminating a need for post-processing corrections after completing the processing of signals.

In an example implementation, the controlling of clocking may comprise introducing a timing-advancement adjustment to signals processed in the at least one path.

In an example implementation, the method may comprise introducing the timing-advancement adjustment before the least one circuit exhibiting nonlinear behavior.

In an example implementation, the controlling of clocking may comprise adjusting timing of a clock applied in the at least one path. The adjusting of timing of the clock may comprise introducing a timing-delay adjustment to the clock when applied to at least one circuit that follows the least one circuit exhibiting nonlinear behavior.

In an example implementation, the at least two separate paths may comprise an in-phase (I) path and a quadrature (Q) path, and the processing of signals comprises processing I and Q components of processed signals via the I-path and Q-path, respectively.

In an example implementation, the effects of the nonlinear behavior may comprise effects of undesired tones or signals introduced because of the nonlinear behavior. The undesired tones or signals may comprise spurious components corresponding to processed signals and/or fold-back counterparts of the spurious components.

An example system, in accordance with the present disclosure, may comprise a first processing path that comprises at least one nonlinear circuit that exhibits nonlinear behavior and one or more other circuits, a second processing path that comprises at least one nonlinear circuit that exhibits nonlinear behavior, and one or more circuits configured for managing nonlinearity during processing of signals in the system. The managing of nonlinearity may comprise assessing effects of the nonlinear behavior during the processing of signals, and controlling clocking applied via one or both of the first processing path and the second processing path based on the assessed effects. In this regard, the controlling of clocking may be configured to reduce the effects of the nonlinear behavior during the processing of signals, thus eliminating a need for applying post-processing corrections after completing the processing of signals.

In an example implementation, one of the first processing path and the second processing path of the system comprises an in-phase (I) processing path operable to process I-components of the signals, and the other one of the of the first processing path and the second processing path comprises a quadrature (Q) processing path operable to process Q-components of the signals.

In an example implementation, the at least one nonlinear circuit, in each of the first processing path and the second processing path of the system, may comprise a digital-to-analog (DAC) circuit or a sample-and-hold (SAH) circuit.

In an example implementation, the one or more circuits, in each of the first processing path and the second processing path of the system, may comprise a sampler.

In an example implementation, the one or more circuits, in each of the first processing path and the second processing path of the system, may comprise a phase-shifter.

In an example implementation, one or both of the first processing path and the second processing path of the system may comprise a timing circuit operable to introduce, in conjunction with the controlling of clocking, a timing-advancement adjustment to signals processed via that path. The timing circuit may precede the least one nonlinear circuit exhibiting nonlinear behavior.

In an example implementation, controlling clocking in the system may comprise adjusting timing of a clock applied in the one or both of the first processing path and the second processing path. The adjusting of timing of the clock may comprise introducing a timing-delay adjustment to the clock when applied to one or more circuits that follows the least one circuit exhibiting nonlinear behavior.

In an example implementation, the system may comprise at least one combining circuit for combining outputs of the first processing path and the second processing path.

In an example implementation, the effects of the nonlinear behavior may comprise effects of undesired tones or signals introduced because of the nonlinear behavior. The undesired tones or signals may comprise spurious components corresponding to processed signals and/or fold-back counterparts of the spurious components.

Figure 1:
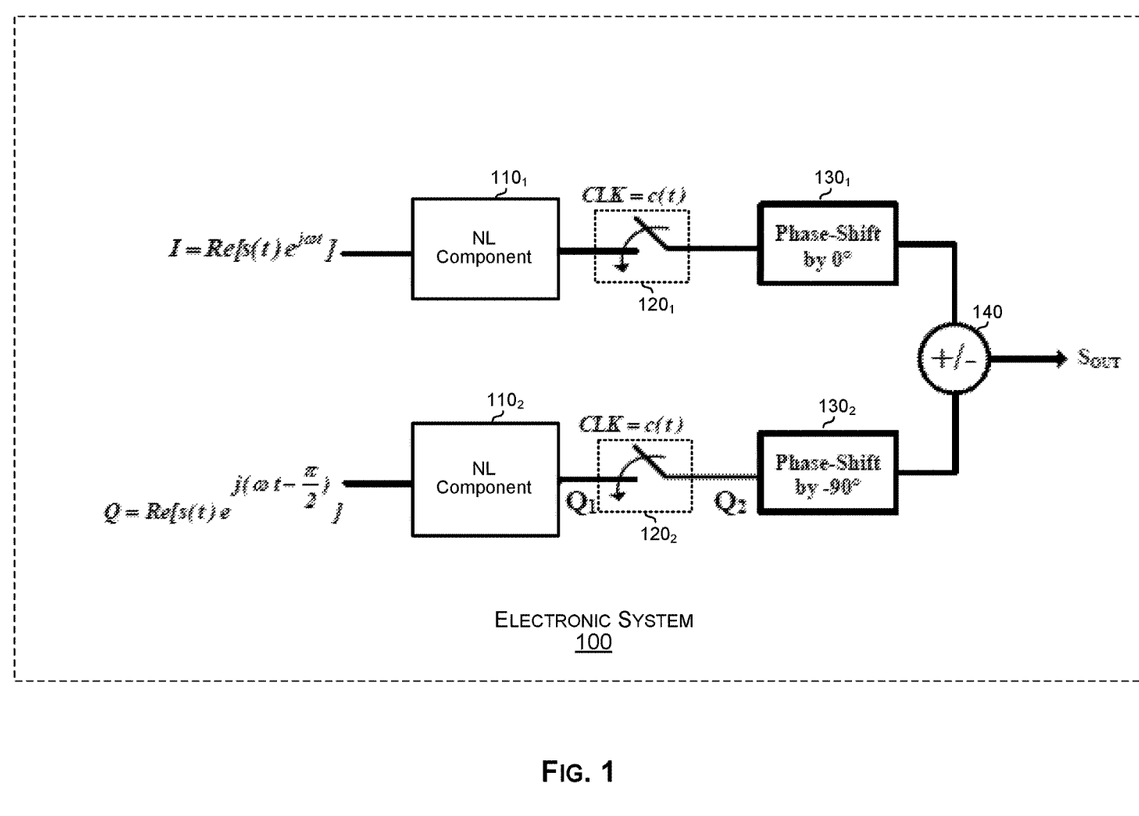
FIG. 1 illustrates an example system that may exhibit nonlinearity.

FIG. 1 illustrates an example system that may exhibit nonlinearity. Shown in FIG. 1 is an electronic system 100.

The electronic system 100 may comprise suitable circuitry for implementing various aspects of the present disclosure. In this regard, the electronic system 100 may support performing, executing or running various operations, functions, applications, and/or services. The electronic system 100 may be used, for example, in executing computer programs, playing video and/or audio content, gaming, performing communication applications or services (e.g., Internet access, browsing, email, text messaging, chatting, voice calling services, etc.), providing networking services (e.g., WiFi hotspot, Bluetooth piconet, Ethernet networking, cable or satellite systems, and/or active 4G/3G/femtocell data channels), etc.

In some instances, the electronic system 100 may be operable to handle or support communications, over wired and/or wireless connections, such as during executing, running, and/or performing of operations, functions, applications, and/or services in the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to perform necessary processing operations to facilitate transmission and/or reception of signals (e.g., RF signals) over supported wired and/or wireless interfaces.

Examples of wireless standards, protocols, and/or interfaces which may be supported and/or used by the electronic system 100 for communication therebetween may comprise wireless personal area network (WPAN) protocols (e.g., as Bluetooth (IEEE 802.15) and ZigBee), near field communication (NFC) standards, wireless local area network (WLAN) protocols (e.g., such as WiFi (IEEE 802.11) standards), cellular standards (including 2G/2G+, such as GSM/GPRS/EDGE, IS-95 or cdmaOne, etc., and 3G/3G+, such as CDMA2000, UMTS, and HSPA, etc.), 4G standards (e.g., WiMAX (IEEE 802.16) and LTE), Ultra-Wideband (UWB), Extremely High Frequency (EHF, such as 60 GHz) Digital TV Standards (e.g., DVB-T/DVB-H, and ISDB-T), etc.

Examples of wireless standards, protocols, and/or interfaces which may be supported and/or used by the electronic system 100 for communication therebetween may comprise Ethernet (IEEE 802.3), Digital Subscriber Line (DSL), Integrated Services Digital Network (ISDN), Fiber Distributed Data Interface (FDDI), cable television and/or internet access standards (e.g., ATSC, DVB-C, DOCSIS, etc.), in-home distribution standards such as Multimedia over Coax Alliance (MoCA), Universal Serial Bus (USB) based standards/protocols/interfaces, etc.

Examples of signal processing operations that may be performed by the electronic system 100 may comprise, for example, one or more of filtering, amplification, analog-to-digital conversion, digital-to-analog conversion, up-conversion, down-conversion, encoding, decoding, encryption, decryption, modulation, demodulation, etc.

In some instances, the electronic system 100 may be configured to support input/output (I/O) operations, to enable receiving input from and/or providing output to users. Accordingly, the electronic system 100 may comprise components or subsystems for obtaining user input and/or providing output to the user. For example, the electronic system 100 may support input/output (I/O) operations for allowing user interactions which may be needed for controlling the electronic system 100 or operations thereof—e.g., allowing users to provide input or commands, for controlling certain functions or components of the electronic system 100, and/or to output or provide feedback pertaining to functions or components. The electronic system 100 may also support input/output (I/O) operations in conjunction with use of data (e.g., multimedia content). For example, the electronic system 100 may support generating, processing, and/or outputting of video and/or acoustic signals, such as via suitable output devices or components (e.g., displays, loudspeakers, etc.). In this regard, the output signals may be generated based on content, which may be in digital form (e.g., digitally formatted music or the like). Similarly, the electronic system 100 may support capturing and processing of video and/or acoustic signals, such as via suitable input devices or components (e.g., cameras, microphones, etc.), to generate (e.g., to store or communicate) corresponding data. The corresponding data may be in digital form (e.g., digitally formatted music, video, or the like).

Accordingly, the electronic system 100 may correspond to (at least portion of) such electronic devices as cellular and smart phones or similar handheld devices, tablets, personal computers, laptops or notebook computers, servers, personal media players, personal digital assistants, set top boxes, satellite receivers, wireless access points, cellular base stations, etc. The disclosure is not limited, however, to particular type of systems, and similar solutions as those described in this disclosure may apply to any suitable system where similar issues (e.g., nonlinearity) are encountered.

In operation, the electronic system 100 may perform various operations, functions, applications, and/or services supported therein. This may entail performing various processing functions, using suitable circuits, whereby signals and/or data may be processed, for example. In some instances, the electronic system 100, and/or components thereof used during operations of the electronic system 100, may exhibit nonlinear characteristics.

For example, components such as digital-to-analog-converters (DACs) and analog-to-digital-converters (ADCs) are particularly known to exhibit nonlinearity during operations (conversions of data or signals between analog and digital) thereof. This may pose significant issues to the operation of the system as a whole. For example, in instances where the electronic system 100 is performing communication operations (transmission and/or reception of signals), and circuit nonlinearity in such components as ADCs and/or DACs, may spawn spurious components related to the signals, called harmonics (or harmonic distortion (HD)) for narrowband signals as well as their fold-back counterparts.

In the example implementation shown in FIG. 1, the electronic system 100 may be configured, in accordance with conventional approaches, for use of quadrature based communication (e.g., quadrature based encoding/decoding of signals), and such may comprise 2 paths—namely, an I-path and a Q-path (I=in-phase, Q=quadrature). Each of the I-path and the Q-path may comprise one or more circuits or components, including nonlinear (NL) components 110$_1$ and 110$_2$, respectively, in each of the I-path and the Q-path, followed by samplers 120$_1$ and 120$_2$, respectively, in each of the I-path and the Q-path, followed by phase-shifters 130$_1$ and 130$_2$, respectively, in each of the I-path and the Q-path. The outputs of the I-path and Q-path may be combined (e.g., added or subtracted) via a mixer 140.

An input signal being processed may be passed through the I-path and Q-path—e.g., through each of the NL components 110$_1$ and 110$_2$, the samplers 120$_1$ and 120$_2$, and the phase-shifters 130$_1$ and 130$_2$. In the example use scenario shown in FIG. 1, the processed signal, s(t), is assumed to be a real signal. In conventional implementations, the same clocking is used in both paths—e.g., both samplers 120$_1$ and 120$_2$ are clocked using the same clock CLK=c(t).

The particular type and/or function of the blocks in each of the paths may differ from system to system and/or based on operations being performed. For example, in up-conversion system/operations, the NL component 110 may be a DAC. The sampler 120 after the NL component 110 may represent the sampling operation integrated in the DAC. The phase-shifters 130 may be implemented using I-Q mixers, that either up-convert or down-convert the signal(s), or poly-phase filters. In up-conversion, the input signal translates to a single side-band, either to a high-side band or to a low-side band, such as based on whether the mixer 140 following the phase-shifters 130 is a subtractor or an adder. Different harmonic components and their fold-back counterparts, which may be generated and/or introduced in the NL components 110, may be up-converted through the mixer 140 at the same side-band as that of the signal, causing such issues as poor signal-to-distortion ratio (SNDR) at the output.

In down-conversion system/operations, the NL component 110 may be a sample-and-hold (SAH) block/circuit, and the sampler 120 after the SAH may represent the sampling operation integrated in the SAH. The phase-shifters 130 may be implemented using analog-to-digital-converters (ADC) followed by discrete-time mixers or ADCs, followed by poly-phase filters. Similar to up-conversion scenarios, in down-conversion scenarios, undesired signals and their fold-back counterparts, which may be generated and/or introduced in the NL components 110, may be down-converted to a frequency close to the desired signal, and as such may adversely affect the output signal (e.g., degrading SNDR).

Handling issues caused by system nonlinearity may be costly and/or ineffective. For example, a significant amount of power consumption during operations of conventional systems may be attributed towards reducing such effects (distortion components). Further, components (circuits) may need to be implemented in inefficient way (e.g., circuits sized up) so as to counteract possible issues (e.g., minimize the mismatch between them), to help reduce distortion components. This would have undesirable effect on the design of the system—e.g., inevitably resulting in larger die area.

Accordingly, in various implementations in accordance with the present disclosure, adaptive measures may be taken to alleviate nonlinearity in systems where nonlinearity-related issues would degrade performance (e.g., in I/Q-based transceivers), and do so in optimal and cost-effective manner resulting in lower power consumption and/or reduction of area in the system. This may be particularly done in sampling-based systems (comprising, e.g., DACs, ADCs, etc.) to relax linearity requirements in the system. Doing so in such systems, particularly ones that employ quadrature encoding of signals (I and Q components) may further allow maximizing bandwidth efficiency. Example implementations in accordance with the present disclosure are described below.

Figure 2:
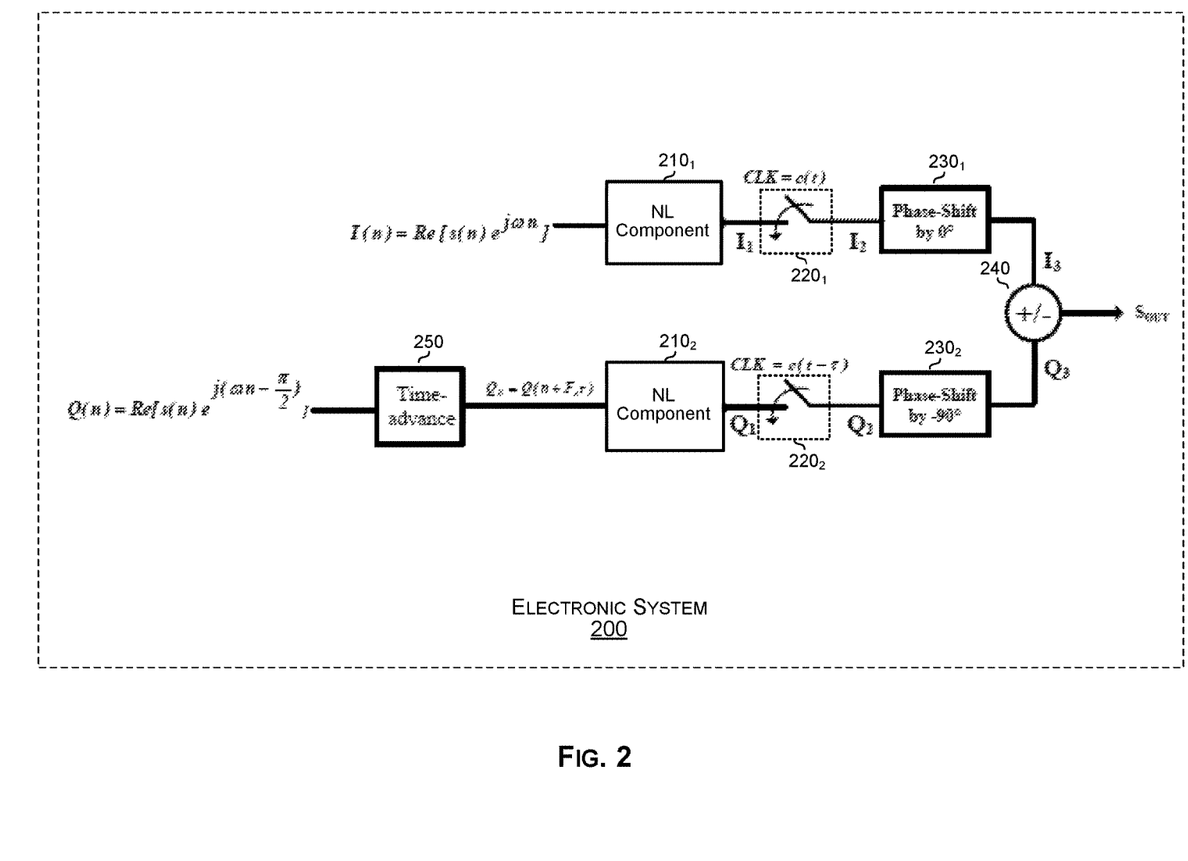
FIG. 2 illustrates an example system that supports use of a clocking scheme for improving distortion when handling discrete-time signals, in accordance with the present disclosure.

FIG. 2 illustrates an example system that supports use of a clocking scheme for improving distortion when handling discrete-time signals, in accordance with the present disclosure. Shown in FIG. 2 is an electronic system 200.

The electronic system 200 may be substantially similar to the electronic system 100 of FIG. 100, for example, and may operate and/or be used in a substantially similar manner. In this regard, as with the electronic system 100, the electronic system 200 may also be configured for performing various operations, functions, applications, and/or services supported therein, and in doing so, the electronic system 200, and/or components thereof, may exhibit nonlinear characteristics during these operations.

For example, as with the electronic system 100, the electronic system 200 may also be configured for use of quadrature based communication (e.g., quadrature based encoding/decoding of signals), and such may comprise 2 paths—namely, an I-path and a Q-path. Each of the I-path and the Q-path may be substantially similar to the I-path and the Q-path, respectively, in the electronic system 100. In this regard, each of the I-path and the Q-path in the electronic system 200 may comprise one or more circuits or components, including nonlinear (NL) components $210_1$ and $210_2$, respectively, in each of the I-path and the Q-path, followed by samplers $220_1$ and $220_2$, respectively, in each of the I-path and the Q-path, followed by phase-shifters $230_1$ and $230_2$, respectively, in each of the I-path and the Q-path. The outputs of the I-path and Q-path may be combined (e.g., added or subtracted) via a mixer 240.

The electronic system 200 may, however, incorporate certain changes for alleviating nonlinearity-related issues, particularly doing so in a cost-effective way. For example, the electronic system 200 may, for example, incorporate use of a modified clocking scheme for adjusting timing in each of the I-path and the Q-path, for mitigating nonlinearity related defects, particularly when handling discrete-time input signals. The clocking used in the system may be configured such that timing of processing functions applied in one or more of the paths (e.g., the I-path and/or the Q-path) may be adjusted to mitigate effects of nonlinearity exhibited in the system—e.g., HD distortion generated and/or introduced by the NL components $210_1$ and $210_2$. This may be done, for example, by time-advancing the input signal in one path (e.g., the Q-path) and/or delaying certain functions applied during processing of the signal in that path (e.g., sampling), by applying certain time adjustment(s) that may be determined adaptively to optimize mitigating nonlinearity-related distortion.

In the example implementation shown in FIG. 2, the electronic system 200, the input signal in Q-path is time-advanced by τ and the sampling-clock of the Q-path is delayed by τ. In this regard, the Q-path may comprise, in addition to the components already described, a time-advance block 250, which may be operable to apply the time adjustment τ, before the NL component $210_1$.

The clocking of the sampler $220_2$ may be adjusted using the same adjustment. Thus, while the sampler $220_1$ in the I-path is clocked using CLK=c(t), the sampler $220_1$ in the I-path is clocked using CLK=c(t−τ).

Figure 3:
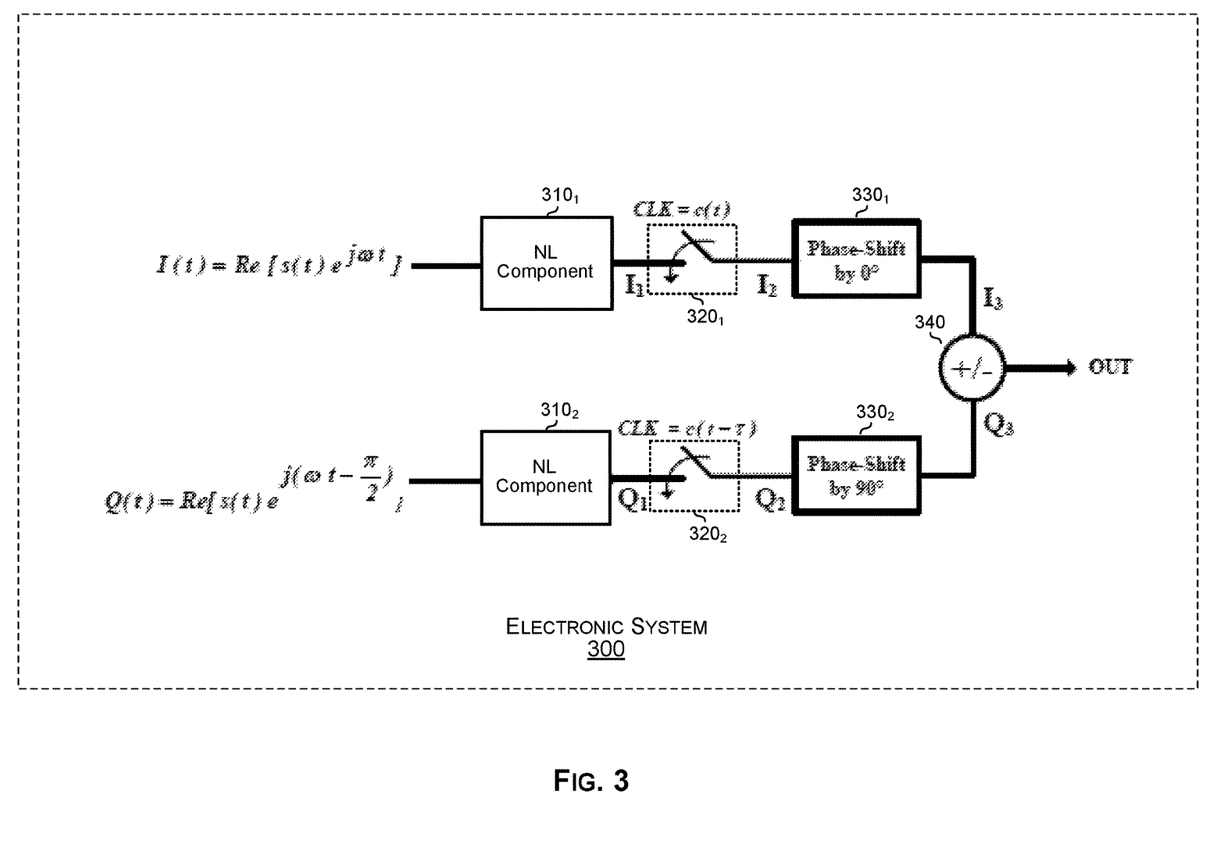
FIG. 3 illustrates an example system that supports use of a clocking scheme for improving distortion, when handling continuous-time signals, in accordance with the present disclosure.

FIG. 3 illustrates an example system that supports use of a clocking scheme for improving distortion, when handling continuous-time signals, in accordance with the present disclosure. Shown in FIG. 3 is an electronic system 300.

The electronic system 300 may be substantially similar to the electronic system 100 of FIG. 100, for example, and may operate and/or be used in a substantially similar manner. In this regard, as with the electronic system 100, the electronic system 300 may also be configured for performing various operations, functions, applications, and/or services supported therein, and in doing so, the electronic system 300, and/or components thereof, may exhibit nonlinear characteristics during these operations.

For example, as with the electronic system 100, the electronic system 300 may also be configured for use of quadrature based communication (e.g., quadrature based encoding/decoding of signals), and such may comprise 2 paths—namely, an I-path and a Q-path. Each of the I-path and the Q-path may be substantially similar to the I-path and the Q-path, respectively, in the electronic system 100. In this regard, each of the I-path and the Q-path in the electronic system 300 may comprise one or more circuits or components, including nonlinear (NL) components $310_1$ and $310_2$, respectively, in each of the I-path and the Q-path, followed by samplers $320_1$ and $320_2$, respectively, in each of the I-path and the Q-path, followed by phase-shifters $330_1$ and $330_2$, respectively, in each of the I-path and the Q-path. The outputs of the I-path and Q-path may be combined (e.g., added or subtracted) via a mixer 340.

The electronic system 300 may also incorporate certain changes for alleviating nonlinearity-related issues, particularly doing so in a cost-effective way. For example, as with the electronic system 200 of FIG. 2, the electronic system 300 may also incorporate use of modified clocking scheme for adjusting timing in each of the I-path and the Q-path, for mitigating nonlinearity related defects. In this regard, the clocking scheme used in the electronic system 300 is configured such that timing of processing functions applied in one or more of the paths (e.g., the I-path and/or the Q-path) may be adjusted to mitigate effects of nonlinearity exhibited in the system—e.g., HD distortion generated and/or introduced by the NL components $310_1$ and $310_2$.

The clocking scheme used in the electronic system 300 is configured, however, for processing continuous-time signals. In this regard, because continuous-time signals do not incur any phase-shift due to sampling using a phase-shifted clock in the Q-path, no time-advancing (and thus no time-advance block/circuit) is used. Rather, the clocking scheme may include applying adjustment (e.g., delay) to a clock used in controlling the samplers $320_1$ and $320_2$. Thus, while the sampler $320_1$ in the I-path is clocked using CLK=c(t), the sampler $320_1$ in the I-path is clocked using CLK=c(t−τ). The delay τ may be determined adaptively to optimize mitigating nonlinearity-related distortion.

However, while no time-advancing is used before the NL components $310_1$ and $310_2$, in some instances additional measures may be taken after the NL components $310_1$ and $310_2$, such as to account for the clocking variations based on implementation details of other components. For example, where the mixer 350 (e.g., adder/subtractor) that follows the phase-shifters $330_1$ and $330_2$ is implemented in the digital-domain, an interpolation-filter may be used to align both I and Q samples to the same clock.

Figure 4A:
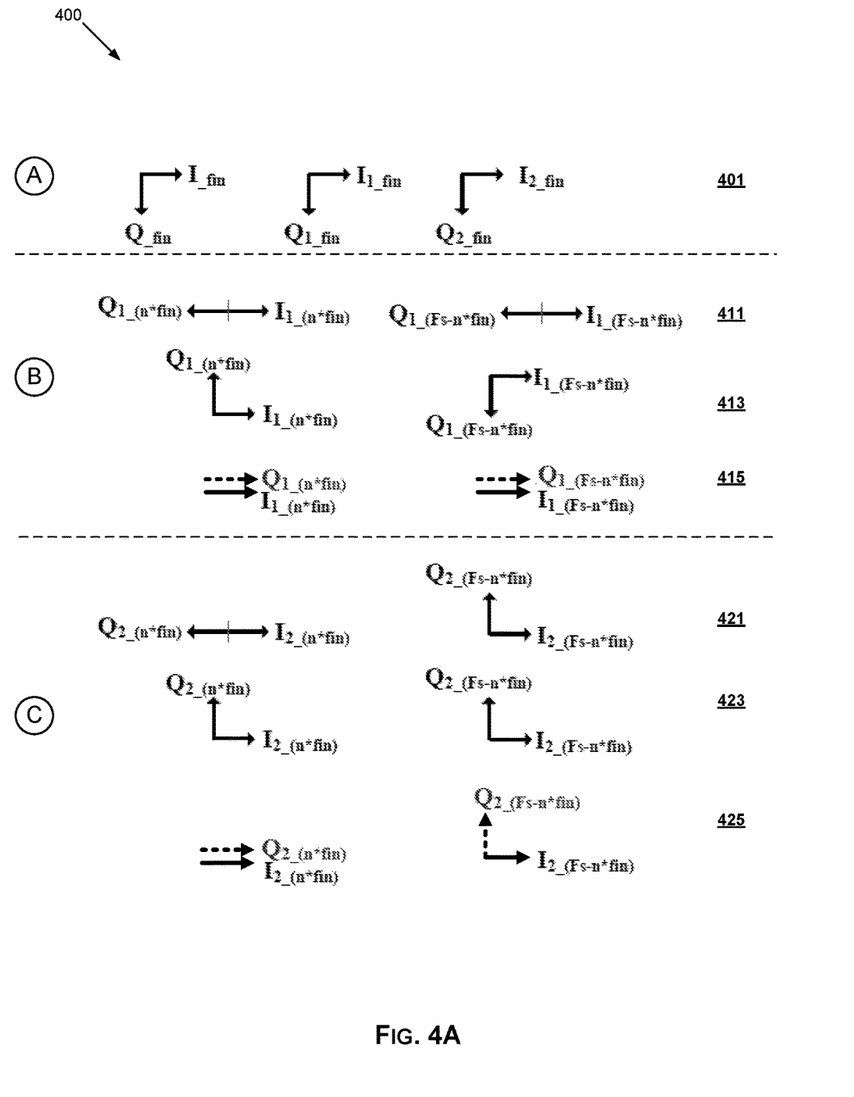
FIGS. 4A-4C illustrate charts for signals during operation of an example nonlinear system with a clocking scheme for improving distortion, in accordance with the present disclosure.
Figure 4B:
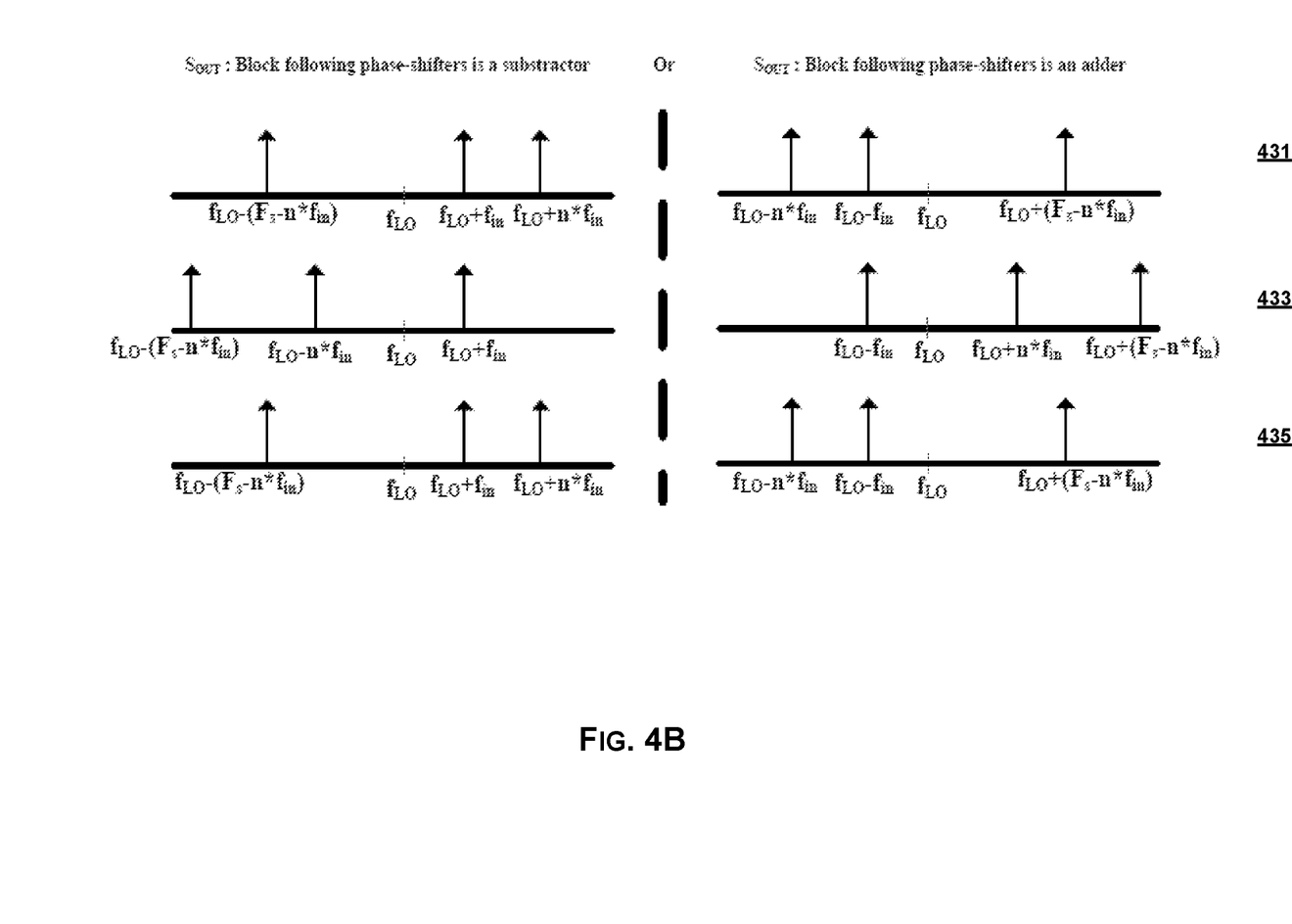
Figure 4C:
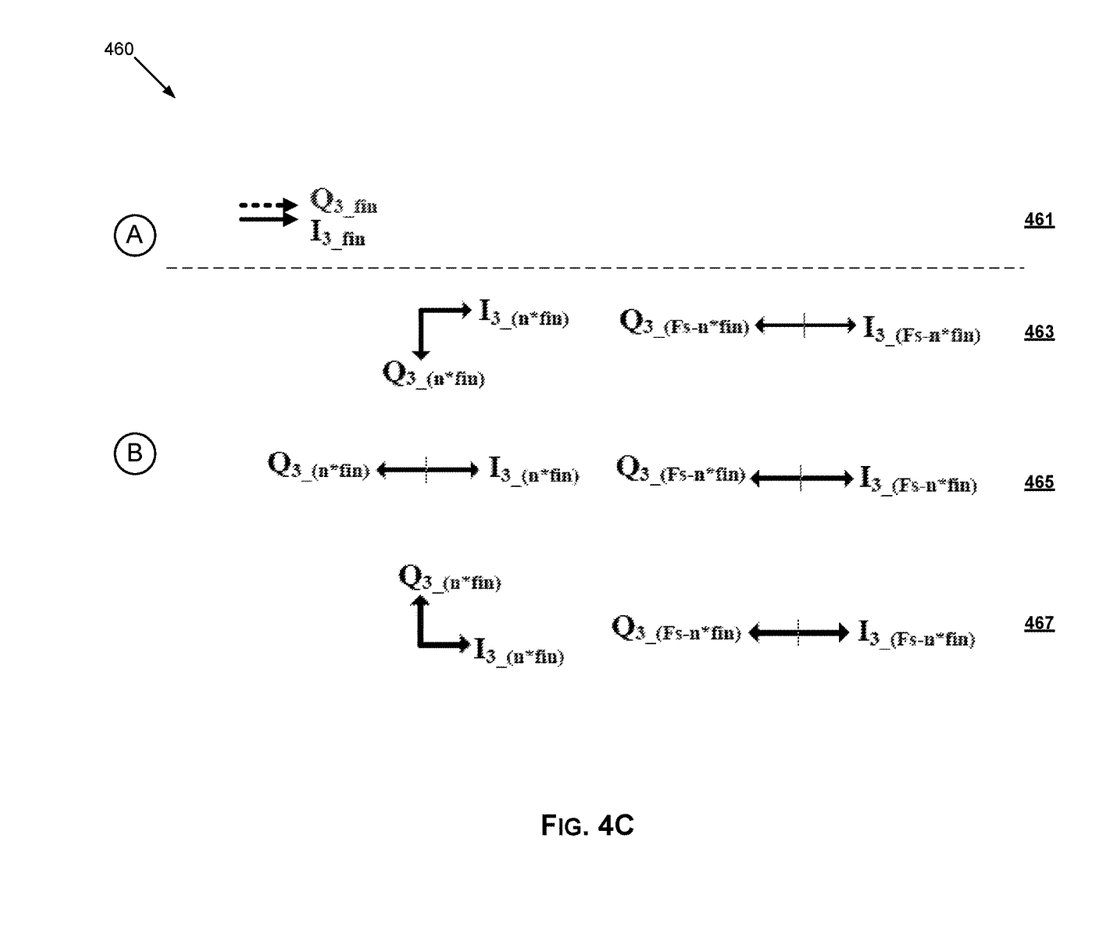

FIGS. 4A-4C illustrate charts for signals during operation of an example nonlinear system with clocking scheme for improving distortion, in accordance with the present disclosure.

FIG. 4A illustrates fundamental and harmonics of signals in the I-path and the Q-path in a sampled nonlinear system incorporating clocking scheme for mitigating nonlinearity distortion (e.g., the electronic system 200 of FIG. 2 and/or the electronic system 300 of FIG. 3), at different points in these paths, up to and before any phase shifting. In particular, shown in FIG. 4A are diagrams corresponding to relative phases of fundamental at different nodes in the system (A); relative phases of undesired tones at outputs of NL components before sampling (B); and relative phases of undesired tones after sampling of outputs of NL components (C).

Diagram 401 illustrates the relative phases of fundamentals at different points in the I-path and Q-path up to the phase-shifters—e.g., I and Q (or $I_{\_fin}$ and $Q_{\_fin}$), corresponding to the inputs to the NL components; $I_1$ and $Q_1$ (or $I_{1\_fin}$ and $Q_{1\_fin}$), corresponding to the outputs of the NL components; and $I_2$ and $Q_2$ (or $I_{2\_fin}$ and $Q_{2\_fin}$), corresponding to the outputs of the samplers, where $f_{in}$ is input frequency.

Diagrams 411, 413, and 415 illustrate the relative phases of undesired tones at outputs of NL components, before sampling. The undesired tones may be expressed as $I_{1\_(n*fin)}$ and $Q_{1\_(n*fin)}$ and $I_{1\_(Fs-n*fin)}$ and $Q_{1\_(Fs-n*fin)}$, where $F_s$ is sampling frequency. Diagrams 411 illustrates the relative phases for these tones at outputs of NL components for n=2, 6, 10, . . . ; whereas diagram 413 illustrates the relative phases for these tones at outputs of NL components for n=3, 7, 11, . . . ; and diagram 415 illustrates the relative phases for these tones at outputs of NL components for n=4, 8, 12, . . . .

Diagrams 421, 423, and 425 illustrate the relative phases of undesired tones at outputs of samplers—i.e., after sampling. As noted above, the undesired tones may be expressed as $I_{1\_(n*fin)}$ and $Q_{1\_(n*fin)}$ and $I_{1\_(Fs-n*fin)}$ and $Q_{1\_(Fs-n*fin)}$. Diagrams 421 illustrates the relative phases for these tones at outputs of samplers for n=2, 6, 10, . . . ; whereas diagram 421 illustrates the relative phases for these tones at outputs of samplers for n=3, 7, 11, . . . ; and diagram 425 illustrates the relative phases for these tones at outputs of samplers for n=4, 8, 12, . . . .

As shown in FIG. 4A, linear phase-advance resulting from time-advance at input of Q-path NL-system is cancelled by linear phase-delay resulting from time-delay of the sampling clock of Q-path NL-system at all signal frequency. Thus the phase-shift may be ignored.

FIG. 4B illustrates relative positions of desired and undesired signals at the output ($S_{OUT}$) of the mixer component (e.g., mixer 250 in the electronic system 200, or mixer 350 in the electronic system 300), in an example system implemented in accordance with the present disclosure and configured for up-conversion system—e.g., particularly where the phase-shifters are implemented using up-conversion quadrature mixers. In particular, as shown in FIG. 4B, the spurious tones (with diagrams 431, 433, and 435 corresponding, respectively, to n=2, 6, 10, . . . , n=3, 7, 11, . . . , and n=4, 8, 12, . . . ) appear at opposite side-band of LO ($f_{LO}$ is frequency of local oscillator) compared to fundamental tone as expressed in the following formulas:

$$F_s - nf_{in} \text{ for } n=2,6,10, \ldots \text{ when } \tau = \frac{1}{4}F_s \quad (1)$$

$$nf_{in} \text{ and } F_s - nf_{in} \text{ for } n=3,7,11, \ldots \text{ when } \tau = \frac{1}{2}F_s \quad (2)$$

$$F_s - nf_{in} \text{ for } n=4,8,12, \ldots \text{ when } \tau = -\frac{1}{4}F_s \quad (3)$$

These tones may be attenuated, such as by use of a band-pass filter (BPF) at the output, or simply by limiting bandwidth of the blocks following the mixers. Since this technique increases the frequency-separation between the desired and undesired signals, the need for sharp bandpass filters to filter-out undesired signals may also be relaxed.

FIG. 4C illustrates relative phases of desired and undesired signals at the input of a mixer block (e.g., mixer 250 in the electronic system 200, or mixer 350 in the electronic system 300) in an example system implemented in accordance with the present disclosure and configured for up-conversion system—e.g., where the mixer is implemented as adder/subtractor, and with phase-shifters implemented using down-conversion quadrature-mixers or poly-phase filters. In this regard, FIG. 4C illustrates (A) relative phases of desired signals at $f_{in}$ (diagram 461) and (B) relative phases of undesired spurious signals and their fold-back counterparts (with diagrams 463, 465, and 467 corresponding, respectively, to n=2, 6, 10, . . . , n=3, 7, 11, . . . , and n=4, 8, 12, . . . ). As shown in FIG. 4C, the spurious tones described above, with respect to FIG. 4B (as expressed using formula 1, 2, and 3, above) may be cancelled at output.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method comprising:
  managing nonlinearity in a transceiver, wherein the transceiver comprises at least two separate processing paths for use when processing signals, and each processing path comprises at least one circuit exhibiting nonlinear behavior during said processing of signals, said managing of nonlinearity comprising:
    assessing effects of said nonlinear behavior during said processing of signals; and
    controlling clocking applied via at least one processing path used during said processing of signals, based on said assessed effects;
  wherein:
    said controlling of clocking is configured to reduce said effects of said nonlinear behavior during said processing of signals;
    said controlling of clocking comprises adjusting timing of a clock applied in said at least one processing path; and
    said adjusting of timing of said clock comprises introducing a timing-delay adjustment to said clock when said clock is applied to at least one circuit that follows said least one circuit exhibiting nonlinear behavior.

2. The method of claim 1, comprising introducing a timing-advancement adjustment to signals processed in said at least one processing path.

3. The method of claim 2, comprising introducing said timing-advancement adjustment before said least one circuit exhibiting nonlinear behavior.

4. The method of claim 1, wherein said at least two separate processing paths comprise an in-phase (I) path and a quadrature (Q) path; and said processing of signals comprises processing I and Q components of processed signals.

5. The method of claim 1, wherein said effects comprise effects of undesired tones or signals introduced because of said nonlinear behavior.

6. The method of claim 5, wherein said undesired tones or signals comprise one or both of spurious components corresponding to processed signals and fold-back counterparts of said spurious components.

7. A system comprising:
a first processing path that comprises at least one nonlinear circuit that exhibits nonlinear behavior and one or more other circuits;
a second processing path that comprises at least one nonlinear circuit that exhibits nonlinear behavior; and
one or more circuits configured for managing nonlinearity during processing of signals in said system, wherein said one or more circuits are operable to:
assess effects of said nonlinear behavior during said processing of signals; and
control clocking applied via one or both of said first processing path and said second processing path based on said assessed effects;
wherein:
said controlling of clocking is configured to reduce said effects of said nonlinear behavior during said processing of signals; and
at least one of said first processing path and said second processing path comprises a timing circuit operable to introduce, in conjunction with said controlling of clocking, a timing-advancement adjustment to processed signals.

8. The system of claim 7, wherein:
one of said first processing path and said second processing path comprises an in-phase (I) path operable to process I-components of processed signals; and
another one of said first processing path and said second processing path comprises a quadrature (Q) path operable to process Q-components of processed signals.

9. The system of claim 7, wherein said at least one nonlinear circuit, in each of said first processing path and said second processing path, comprises a digital-to-analog (DAC) circuit or a sample-and-hold (SAH) circuit.

10. The system of claim 7, wherein said one or more circuits, in each of said first processing path and said second processing path, comprise a sampler circuit.

11. The system of claim 7, wherein said one or more circuits, in each of said first processing path and said second processing path, comprise a phase-shifter circuit.

12. The system of claim 7, wherein said timing circuit precedes said least one nonlinear circuit exhibiting nonlinear behavior.

13. The system of claim 7, wherein said controlling of clocking comprises adjusting timing of a clock applied in said one or both of said first processing path and said second processing path.

14. The system of claim 13, wherein said adjusting of timing of said clock comprises introducing a timing-delay adjustment to said clock when applied to one or more circuits that follows said least one circuit exhibiting nonlinear behavior.

15. The system of claim 7, comprising at least one combining circuit for combining outputs of said first processing path and said second processing path.

16. The system of claim 7, wherein said effects comprise effects of undesired tones or signals introduced because of said nonlinear behavior.

17. The system of claim 16, wherein said undesired tones or signals comprise one or both of spurious components corresponding to processed signals and fold-back counterparts of said spurious components.

18. A system comprising:
a first processing path that comprises at least one nonlinear circuit that exhibits nonlinear behavior and one or more other circuits;
a second processing path that comprises at least one nonlinear circuit that exhibits nonlinear behavior; and
one or more circuits configured for managing nonlinearity during processing of signals in said system, wherein said one or more circuits are operable to:
assess effects of said nonlinear behavior during said processing of signals; and
control clocking applied via one or both of said first processing path and said second processing path based on said assessed effects;
wherein:
said controlling of clocking is configured to reduce said effects of said nonlinear behavior during said processing of signals;
said controlling of clocking comprises adjusting timing of a clock applied in said one or both of said first processing path and said second processing path; and
said adjusting of timing of said clock comprises introducing a timing-delay adjustment to said clock when applied to one or more circuits that follows said least one circuit exhibiting nonlinear behavior.

19. The system of claim 18, wherein:
one of said first processing path and said second processing path comprises an in-phase (I) path operable to process I-components of processed signals; and
another one of said first processing path and said second processing path comprises a quadrature (Q) path operable to process Q-components of processed signals.

20. The system of claim 18, wherein said at least one nonlinear circuit, in each of said first processing path and said second processing path, comprises a digital-to-analog (DAC) circuit or a sample-and-hold (SAH) circuit.

21. The system of claim 18, wherein said one or more circuits, in each of said first processing path and said second processing path, comprise a sampler circuit.

22. The system of claim 18, wherein said one or more circuits, in each of said first processing path and said second processing path, comprise a phase-shifter circuit.

23. The system of claim 18, comprising at least one combining circuit for combining outputs of said first processing path and said second processing path.

24. The system of claim 18, wherein said effects comprise effects of undesired tones or signals introduced because of said nonlinear behavior.

25. The system of claim 24, wherein said undesired tones or signals comprise one or both of spurious components corresponding to processed signals and fold-back counterparts of said spurious components.

* * * * *